United States Patent
Ring et al.

(10) Patent No.: US 6,686,757 B1
(45) Date of Patent: Feb. 3, 2004

(54) DEFECT DETECTION IN SEMICONDUCTOR DEVICES

(75) Inventors: Rosalinda M. Ring, Austin, TX (US); Rama R. Goruganthu, Austin, TX (US); Brennan V. Davis, Austin, TX (US); Jeffrey D. Birdsley, Austin, TX (US); Michael R. Bruce, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,217

(22) Filed: Sep. 30, 1999

(51) Int. Cl.[7] .................. G01R 31/28; G01R 31/303; G01R 31/311
(52) U.S. Cl. .................. 324/765; 324/750; 324/752
(58) Field of Search ............... 324/750, 751, 324/752, 501, 755, 765; 73/632, 643

(56) References Cited

U.S. PATENT DOCUMENTS

| | | | | |
|---|---|---|---|---|
| 5,661,408 A | * | 8/1997 | Kamieniecki et al. | 324/752 |
| 5,801,540 A | * | 9/1998 | Sakaguchi | 324/751 |
| 5,804,980 A | * | 9/1998 | Nikawa | 324/752 |
| 5,905,381 A | * | 5/1999 | Wu | 324/765 |
| 6,140,826 A | * | 10/2000 | Jeng | 324/765 |
| 6,229,319 B1 | * | 5/2001 | Johnson | 324/755 |
| 6,335,629 B1 | * | 1/2002 | Lee et al. | 324/755 |

* cited by examiner

Primary Examiner—Ernest Karlsen

(57) ABSTRACT

According to an example embodiment of the present invention, a defect detection approach involves detecting the existence of defects in an integrated circuit as a function of at least one applied energy source. In response to energy that is applied to the integrated circuit, response signals are detected. A parameter including information such as amplitude, frequency, phase, or a spectrum is developed for a reference integrated circuit device and then compared to the detected response signal. The deviation in the response and reference signals, and the type of energy source used, are correlated to a particular defect in the device.

16 Claims, 4 Drawing Sheets

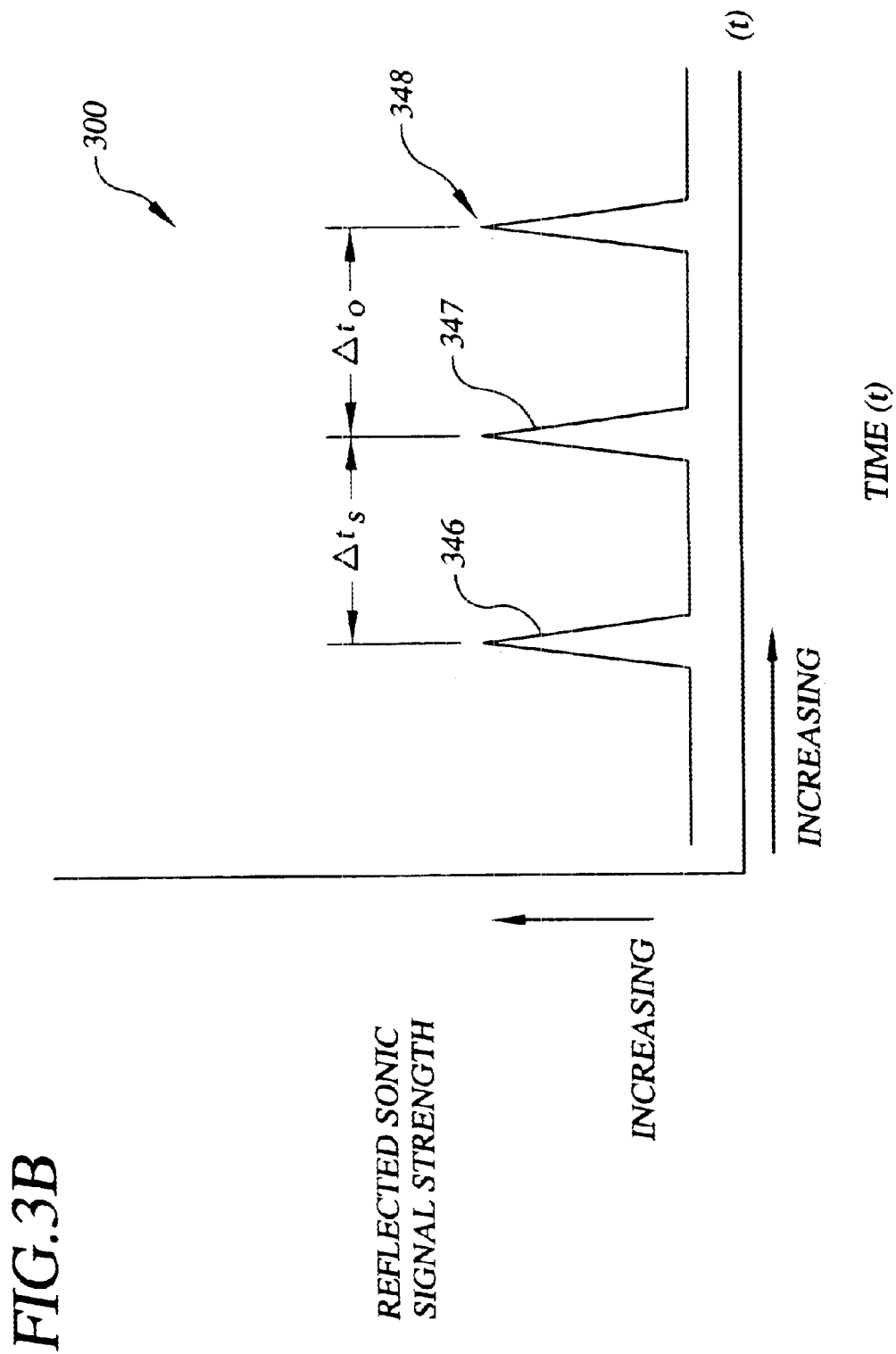

DEFECT DETECTION IN SEMICONDUCTOR DEVICES

RELATED APPLICATIONS

The present invention is related to U.S. patent application Ser. No. 09/410,147 entitled "ACOUSTIC THREE DIMENSIONAL ANALYSIS OF CIRCUIT STRUCTURES" and filed on Sep. 30, 1999, now U.S. Pat. No. 6,430,728; and to U.S. patent application Ser. No. 09/387,182, having entitled "MICRO-VOID DETECTION" and filed on Aug. 31, 1999, now U.S. Pat. No. 6,253,621, which are incorporated herein by reference.

FIELD OF THE INVENTION

The present invention relates generally to semiconductor devices and their fabrication and, more particularly, to semiconductor devices and their manufacture involving testing the devices for defects.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors operating at speeds of hundreds of millions of instructions per second to be packaged in relatively small, air-cooled semiconductor device packages. A by-product of such high-density and high functionality has been an increase in the number and complexity of the manufacturing processes, as well as an increase in the difficulties of maintaining satisfactory levels of quality control, testing the devices for defects, and providing a cost-effective product using such processes.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Traditionally, integrated circuits have been tested using methods including directly accessing circuitry or devices within the integrated circuit. In addition, many methods require the circuit to be powered. Directly accessing the circuitry is difficult for several reasons. For instance, in flip-chip type dies, transistors and other circuitry are located in a very thin epitaxially-grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the chip.

Since access to the transistors and circuitry in flip-chips is generally from the back side of the device, it is often necessary to mill through the back side and probe certain circuit elements in order to test the device. Milling through the back side is often difficult and time consuming. Moreover, circuitry and devices in the integrated circuit may potentially be damaged by milling processes. The difficulty, cost, and destructive aspects of existing methods for testing integrated circuits are impediments to the growth and improvement of semiconductor technologies.

SUMMARY OF THE INVENTION

The present invention is exemplified in a number of implementations and applications, some of which are summarized below. According to an example embodiment, the present invention is directed to a method for conducting failure analysis of an integrated circuit. A plurality of response signals, generated from an energy source applied to the integrated circuit, are detected and circuit defects are identified as a function of defined deviations between the detected response signals and the reference signal and as a function of the energy source or sources used to generate the response signals.

According to another example embodiment of the present invention, a system is arranged for testing an integrated circuit having circuitry in a circuit side opposite a back side. The system includes a substrate removal device and at least one energy source configured and arranged to excite circuitry in the integrated circuit. The system also includes a plurality of energy source detectors and a computer arrangement configured to correlate detected response signals with a reference signal to determine the amount of deviation between signals. The computer arrangement will also identify the type of defect in the circuit as a function of the signal deviations and as function of the energy source used to generate the response signal. The defect can also be detected via an outside source, such as a human operator viewing a computer-generated parameter. In an example embodiment, the computer, the laser, and the acoustic energy detectors are communicatively coupled.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 3B is an example graph showing reflected sonic strength versus time for circuits having defects, according to the teachings of the present invention.

Figure 1:
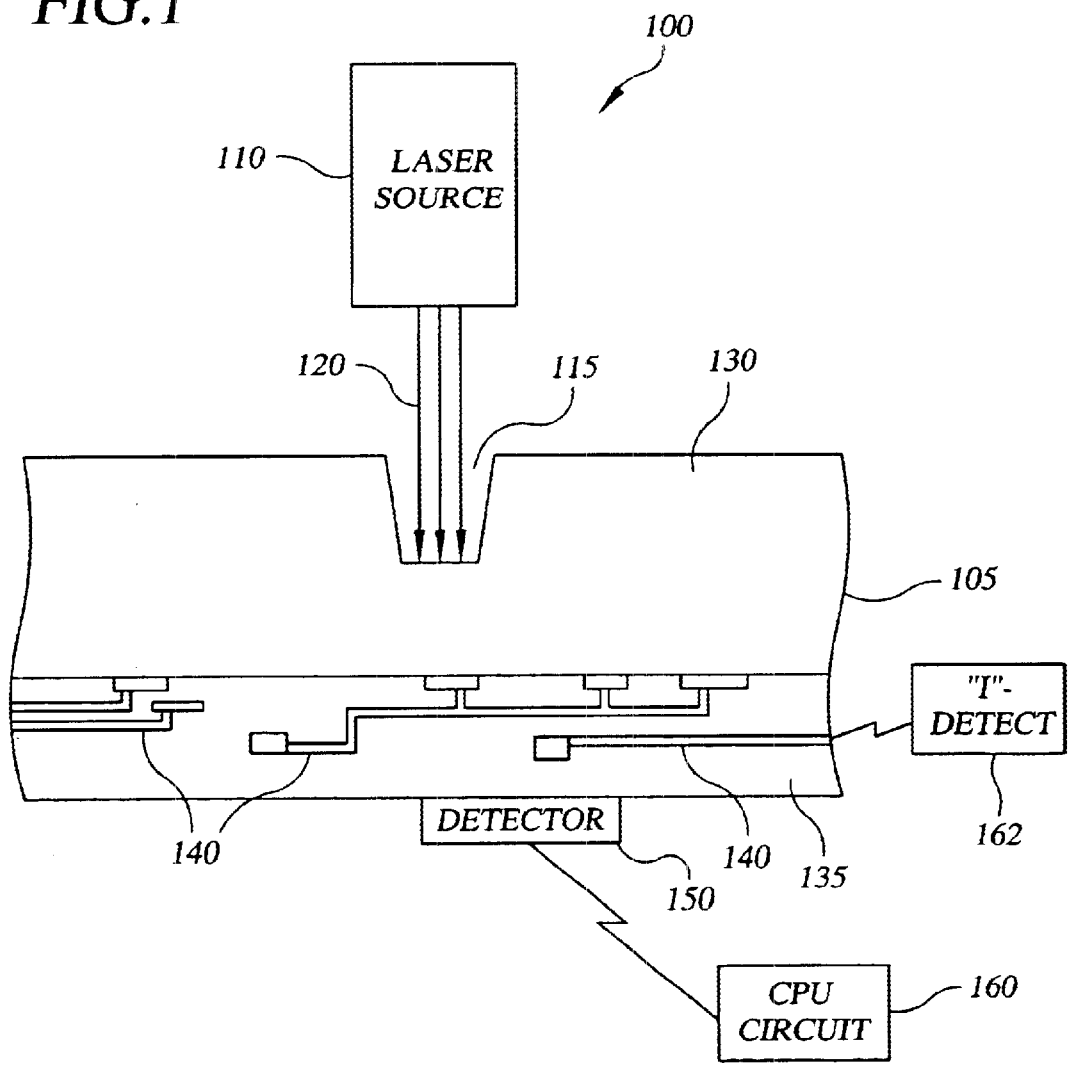
FIG. 1 shows an integrated circuit device undergoing testing, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices requiring or benefiting from defect analysis. The invention has been found to be particularly suited for post-manufacturing failure analysis of semiconductor devices having target circuitry containing defects such as shorts, opens, partial-opens and microvoids in the circuit structure. While the present invention is not necessarily limited to such devices, various aspects of the invention may be appreciated through a discussion of various examples using this context.

According to an example embodiment of the present invention, energy sources that are applied to an integrated circuit generate detectable response signals. It has been discovered that the response signals that are emitted vary relative to the types of defects in the circuit and the type of energy sources used. In this manner, the detected response signals and the type of energy source(s) that is (are) applied are used to detect the type of defect that exists in the integrated circuit.

According to a more particular example embodiment shown in FIG. 1, a system 100 is used and a target region 115 of the back side 130 of an integrated circuit die 105, having a back side opposite circuitry 140 and a circuit side 135, is thinned. The device may be thinned, for example, using a laser etching device, a FIB, chemical-mechanical polishing, or other suitable removal device. A laser device 110 is used and a laser beam 120 of a wavelength of about 1064 nanometers is directed at the thinned portion of the back side 130 and optical beam induced current (OBIC) is created, resulting in pn junction activity. OBIC occurs when electron-hole pairs are generated in the die substrate and the photo-generated carriers diffuse to a depletion region. Electron-hole pairs may also be created directly in the depletion region by the laser, contributing to the OBIC. The OBIC generates acoustic energy that varies in relation to the mass of circuitry coupled to the region in which the OBIC is created. The acoustic energy is detected via detector 150, which is coupled to computer arrangement 160, and is used for defect analysis. The detector 150 may include an acoustic transducer. A current detector 162, also coupled to the computer arrangement 160, detects OBIC by monitoring (e.g., probing) a metal layer couple to the target circuitry generating the OBIC.

Figure 2:
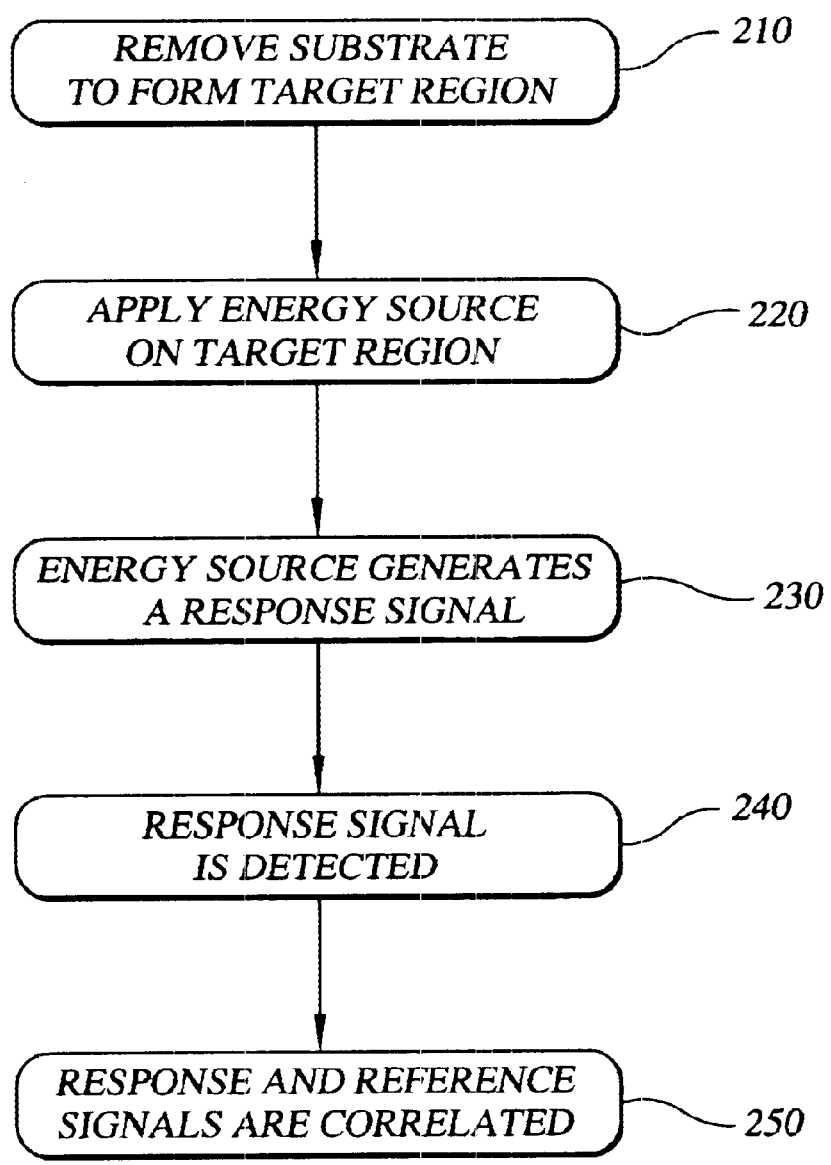
FIG. 2 is a flow diagram for a method of testing an integrated circuit device, according to another example embodiment of the present invention.

FIG. 2 is a flow diagram showing a method for analyzing a semiconductor device, according to another example embodiment of the present invention. Substrate is removed from a target region at block 210. An energy source is applied to the target region at block 220 and the source generates a response signal that is emitted from die 105 at block 230. The response signal that is emitted is detected in the device at block 240. The detected response signal is correlated with the reference signal to identify the type of defect that exists at block 250. One or more tasks are then repeated depending on the sources and detectors that are used. Depending on the type (or types) of applied source (or sources), it is possible to eliminate the separate step of removing substrate material and using the energy source to mill the substrate, and then applying energy to the target region (such as using FIB to mill and SIMS to detect progress of the milling operation).

In order to develop the reference signal profiles for each of the energy sources, a non-defective integrated circuit is thinned and an exposed region is formed. The energy source is applied at the exposed region and the response signal is generated, which in turn emits the signal from the device. At least one parameter corresponding to the type of signal is determined and recorded as a standard parameter. The parameter may, for example, include amplitude, frequency, or phase information for an acoustic application. If light is applied as the energy source the parameter may include a spectrum and wavelength of light. Using the recorded standard parameter or parameters of the non-defective die for comparison, an integrated circuit device is then analyzed using the recorded parameter(s) as a reference for comparison.

More specifically, an energy source is applied to silicon over a target circuit region of the device under test, and a response signal is generated in the device. The emitted signal is detected and parameter(s) corresponding to the emitted signal is determined. The parameter is then compared to the reference parameter(s) to determine the existence of defects. For example, the reference parameter(s) can be used in pass-fail testing, whereby the parameter(s) from a device under test approximately matches the reference parameter(s) if it is to pass.

TABLE A

| | Sensors | | | | |
|---|---|---|---|---|---|
| Energy Source | Camera | Microscope | Spectrometer | Transoucer | Mag. Field |
| Electrical | Photo Emissions | | | | |
| nIR | | Image Circuitry | | | |
| ION Beam | | √ | Electrons, IONS, Photons | | |
| E-Beam | | √ | Electrons ($1^{st}$, $2^{nd}$) Auger, Backscattered Photons | | |
| X-Ray | | √ | X-ray Emissions | | |
| Acoustic | | | | Acoustic Wave | |
| Heat | | | | Acoustic Wave | |
| MRI (Magnetic) | | | | | Magnectic Field Changes (Gauss) |

Table A (above) illustrates various example energy sources that can be applied on an integrated circuit to generate measurable/detectable response signals that are emitted from the circuit. Passive energy sources include nIR, sonic, ultrasonic and magnetic. energy (for MRI applications). Acoustic waves are generated by the internal vibrations within a device that are stimulated by a laser, an ion beam, an electron beam, an x-ray beam and heat. Knowing the energy source and its corresponding reference curve for a non-defective device, it is possible to generate a set of curves for the type of defect (shorts, opens, microvoids, etc.). These curves can be stored in a database and used in comparison with the reference curves to identify the type of defect in the device. For instance, a computer can store this information in its database and be instructed that the energy source is a laser. The computer will access the reference and defect curves that are relevant for laser energy sources and use this information to compare with an actual response signal that is emitted from the device. In this manner, the defect and its location is identifiable without having to determine which energy source(s) to use first for a subsequent detailed level of analysis.

Figure 3A:
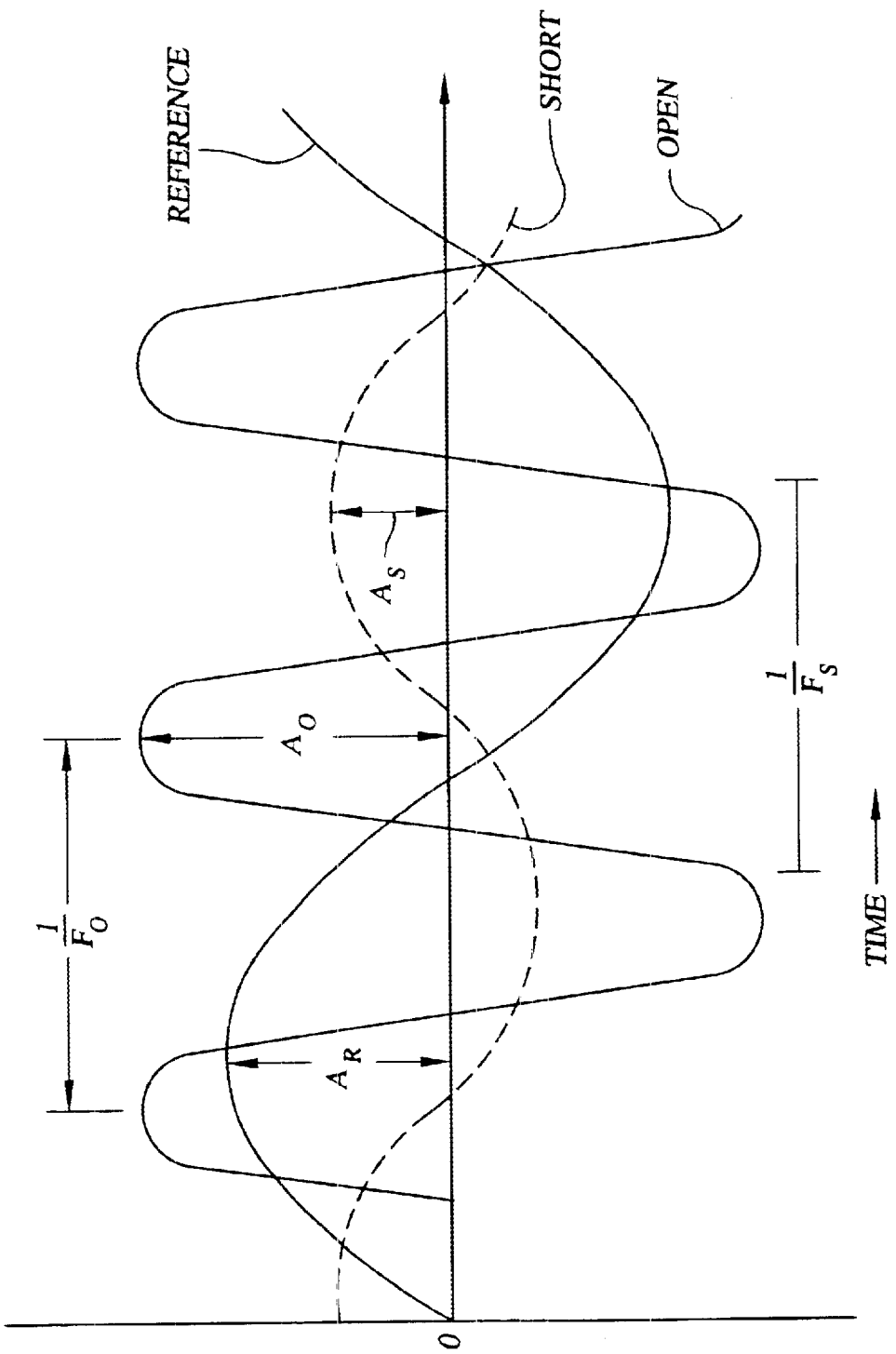
FIG. 3A is a graph illustrating the deviation of an acoustic wave from the response signal and the reference signal detecting a short and an open circuit, according to the teachings of the present invention.

As another example application, when there is a short circuit in the portion of circuitry in the die, more circuitry is affected by the applied energy via the short. This additional circuitry effectively increases the amount of circuit mass affected by the applied energy as compared to the amount of affected circuitry without the short. As shown in FIG. 3A, for example, where light or heat is the energy source that generates an acoustic wave (a response signal) within the device, as the mass increases, both the frequency ($F_S$) and amplitude ($A_S$) of the acoustic energy propagation (see $F_S$, $A_S$ and curve denoted as SHORT) will change accordingly. The phase may be detected by synchronizing the acoustic detector with a laser (i.e. light source). Therefore, a die can be tested using OBIC and, based on a variation in frequency, amplitude, and/or phase parameter, shorts can be detected. The parameter variations may, for example, be determined by comparing the detected response signal parameter to a reference parameter developed from a non-defective die. This method includes additional advantages in that it does not require the device to be powered, nor does it require direct access to circuitry within the device.

Referring to FIG. 3B, there is shown an example of sonic energy being applied to die 105 resulting in a graph 300 depicting signal strength versus time (t) measurement. Reflection of the reference signal from the original circuit is represented in the graph as spike 347, and the reflection of the signal from the short circuit in the substrate is represented in the graph as spike 346. Spike 347 (reference signal) is received at a time $\Delta t$ (here $\Delta t_s$) after spike 346 (response signal that detects defect) since the additional mass from a short circuit reflects the sonic wave faster. Using the time differential between the spikes and the speed of the sonic energy the area where the defect is located can be determined. Usually a medium, such as water is used, to simplify calculations. For example, if the medium is water at 20° C., the speed of sound through the liquid is 1470 m/sec. By using the equation d=$\Delta t$*1470 m/sec, measuring $\Delta t$ and solving for d (depth or material thickness), the result is the depth in meters (to detect the additional mass).

Open circuits in circuitry within the device reduce the amount of metal mass affected by the energy applied as compared to circuitry not having an open circuit. When a laser is used as the energy source it generates an OBIC that in turn emits an acoustic wave (a response signal) within the device. As illustrated in FIG. 3A, as the circuit mass decreases, both the frequency ($F_O$) and amplitude ($A_O$) of the acoustic energy propagation increase (versus $A_R$—reference amplitude), and the phase is advanced (see curve denoted as OPEN).

Referring now to FIG. 3B, reflection of the reference signal from the original circuit is represented in the graph as spike 347, and the reflection of the signal from the open circuit in the substrate is represented in the graph as spike 348. Spike 347 (reference signal) is received at a time $\Delta t_o$ before spike 348 (response signal that detects open circuit) since the decrease in mass from an open circuit reflects the sonic wave slower. Using the time differential between the spikes and the speed of the sonic energy the area where the defect is located can be determined.

Microvoids are defects created within the metal structure of an IC device. that lack sufficient metal to conduct and complete the circuit. Optical scanning can be used for analysis, but primarily for the layers above the metal layers. Acoustic energy has been found to be useful for defect detection. Energy is applied to the IC device so as to create an acoustic wave. The speed of reflected and returned waves is related to the density of the material through which the waves pass. An index of refraction is determined from this speed of reflection. When an acoustic wave encounters a void in the conductive structure of the device, the difference in density results in an index of refraction that is different than a similarly-obtained index from an area not having a void. The calculated index of refraction is then used to determine whether a void exists in the device. For further information on microvoid detection, reference may be made to the above-referenced patent document entitled "Microvoid Detection."

While the present invention has been described with reference to several particular example embodiments, those skilled in the art will recognize that many changes may be made thereto without departing from the spirit and scope of the present invention, which is set forth in the following claims.

What is claimed is:

1. A method for testing an integrated circuit, wherein the circuit has circuitry in a circuit side opposite a back side, the method comprising:

removing substrate from the back side and exposing a target region;

applying an energy source at the target region, thereby generating a plurality response signals from the integrated circuit;

detecting the response signals from in the integrated circuit via at least one detector;

correlating the detected response signals with a reference signal to determine the amount of deviation from the reference signal; and identifying the type of defect in the circuit as a function of the deviation between the detected response signals and the reference signal and as function of the energy source used to generate the response signal.

2. The method for testing an integrated circuit according to claim 1, wherein applying an energy source at the target region includes using a passive source that includes at least one of nIR, sonic and ultrasonic energy.

3. The method for testing an integrated circuit according to claim 1, wherein applying an energy source at the target region includes using a source that generates acoustic signals due to the internal vibrations within the circuit, the source including at least one of a laser and a heat generating device.

4. The method for testing an integrated circuit according to claim 1, wherein applying an energy source includes using at least one of: an ion beam, an electron beam and an x-ray beam.

5. The method for testing an integrated circuit according to claim 1, wherein the energy source is synchronized with the at least one detector, and wherein identifying the type of defect includes detecting the shift of the correlated detected signal versus the reference signal.

6. The method for testing an integrated circuit according to claim 1, wherein correlating the detected response signal to a reference signal includes using a computer arrangement.

7. The method for testing an integrated circuit according to claim 1, wherein identifying the type of defect in the circuit as a function of the defined deviation between the response signal and the reference signal identifying at least one of: an open circuit, a short circuit, a partial open and a microvoid.

8. The method for testing an integrated circuit according to claim 1, wherein identifying at least one defect in the circuit as a function of the defined deviation between the response signal and the reference signal includes comparing the correlated detected signal to a reference signal for a non-defective integrated circuit.

9. The method for testing an integrated circuit, according to claim 1, wherein the integrated circuit is not powered.

10. The method for testing an integrated circuit, according to claim 8, wherein removing substrate from the back side and exposing a target region includes removing an amount of substrate that corresponds to an amount of substrate removed from the non-defective integrated circuit when the reference parameter was ascertained.

11. A system for testing an integrated circuit having circuitry in a circuit side opposite a back side, the system comprising:

means for removing substrate from the back side;

an energy source adapted to generate response signals that is emitted from the integrated circuit;

means for detecting the response signals emitted from the integrated circuit;

means for correlating the detected response signals with a reference signal to determine the amount of deviation from the reference signal that has occurred; and means for identifying the type of defect in the circuit as a function of the deviation and the energy source used to generate the response signals.

12. A system for testing an integrated circuit having circuitry in a circuit side opposite a back side, the system comprising:

a substrate removal device;

an energy source configured and arranged to excite circuitry in the integrated circuit;

a plurality of energy source detectors; and a computer arrangement configured to correlate detected response signals with a reference signal to determine the amount of deviation between signals, and to identify the type of defect in the circuit as a function of the signal deviations and as function of the energy source used to generate the response signal.

13. The system for testing an integrated circuit, according to claim 12, wherein the energy source, the at least one energy source detector, and the computer are communicatively coupled.

14. The system for testing an integrated circuit, according to claim 13, wherein the computer is configured and arranged to control the energy source.

15. A system for testing an integrated circuit, according to claim 12, wherein the computer is further configured and arranged to detect at least one defect in the integrated circuit using the correlated detected response signals.

16. A system for testing an integrated circuit according to claim 15, wherein the computer is configured and arranged to detect at least one of: a short circuit, an open circuit, a partial open circuit and a microvoid.

* * * * *